(12) United States Patent
Jain

(10) Patent No.: US 7,333,388 B2
(45) Date of Patent: Feb. 19, 2008

(54) MULTI-PORT MEMORY CELLS

(75) Inventor: Raj Kumar Jain, Singapore (SG)

(73) Assignee: Infineon Technologies Aktiengesellschaft, Munich (DE)

(*) Notice: Subject to any disclaimer, the term of this patent is extended or adjusted under 35 U.S.C. 154(b) by 0 days.

(21) Appl. No.: 10/065,212

(22) Filed: Sep. 26, 2002

(65) Prior Publication Data

US 2003/0063515 A1    Apr. 3, 2003

Related U.S. Application Data

(63) Continuation-in-part of application No. 10/131,364, filed on Apr. 24, 2002, now Pat. No. 6,628,541, and a continuation-in-part of application No. 09/806,299, filed on Oct. 3, 2001, now Pat. No. 6,552,951.

(51) Int. Cl.
  *G11C 8/00*    (2006.01)
(52) U.S. Cl. ............. 365/230.05; 365/222; 365/189.04
(58) Field of Classification Search .......... 365/230.05, 365/230.01, 236, 189.04, 222, 104
  See application file for complete search history.

(56) References Cited

U.S. PATENT DOCUMENTS

| | | | | |
|---|---|---|---|---|
| 4,577,293 A | | 3/1986 | Matick et al. | |
| 5,459,851 A | | 10/1995 | Nakajima et al. | |
| 5,566,318 A | * | 10/1996 | Joseph | 365/230.08 |
| 5,657,266 A | * | 8/1997 | McLaury | 365/149 |
| 5,687,123 A | * | 11/1997 | Hidaka et al. | 365/189.09 |
| 5,822,760 A | * | 10/1998 | Yoshizawa et al. | 711/137 |
| 5,844,856 A | * | 12/1998 | Taylor | 365/230.05 |
| 5,887,272 A | * | 3/1999 | Sartore et al. | 365/189.05 |
| 5,999,474 A | | 12/1999 | Leung et al. | |
| 6,131,140 A | * | 10/2000 | Rodgers et al. | 711/104 |
| 6,167,491 A | * | 12/2000 | McAlpine | 711/149 |
| 6,216,205 B1 | * | 4/2001 | Chin et al. | 365/230.05 |
| 6,256,256 B1 | * | 7/2001 | Rao | 365/230.05 |
| 6,546,461 B1 | * | 4/2003 | Au et al. | 365/189.02 |
| 6,552,951 B1 | | 4/2003 | Raj et al. | |
| 6,594,196 B2 | * | 7/2003 | Hsu et al. | 365/230.05 |
| 2002/0056020 A1 | | 5/2002 | Sartore et al. | |
| 2002/0065997 A1 | * | 5/2002 | Hsu et al. | 711/158 |

FOREIGN PATENT DOCUMENTS

| | | |
|---|---|---|
| JP | S61-011993 | 1/1986 |
| JP | S63-144494 | 6/1988 |
| JP | H06-337815 | 12/1994 |
| JP | H07-175713 | 7/1995 |

\* cited by examiner

*Primary Examiner*—Thong Q. Le
(74) *Attorney, Agent, or Firm*—Horizon IP Pte. Ltd.

(57) ABSTRACT

A memory array comprises memory cells of the dynamic type having a first and a second port. A cache memory is connected to the address and data paths of the first and second ports. A refresh operation is performed through one of said ports. When a refresh operation is performed through said one port, a read operation can be performed through the cache memory in parallel.

25 Claims, 3 Drawing Sheets

MULTI-PORT MEMORY CELLS

CROSS REFERENCE TO RELATED APPLICATIONS

This is a continuation-in-part of patent applications, titled: "Dual-Port Memory Cell", U.S. Ser. No. 09/806,299, now U.S. Ser. No. 6,552,951 and "Memory Architecture with Refresh and Sense Amplifiers", U.S. Ser. No. 10/131,364, now U.S. Ser. No. 6,628,541.

BACKGROUND OF THE INVENTION

Integrated circuits (ICs) can include an array of dynamic random access memory cells. Each memory cell comprises a storage node carrying a charge which represents the information to be stored. The charge stored within the storage node leaks due to parasitic current paths. The storage node has to be refreshed prior to the charge leaking beyond a threshold value which can be detected by a sense amplifier. During a refresh cycle, information stored in the memory cells are read out, amplified, and written back into the memory cells.

When the memory cells are refreshed, access to the array is prevented. This is because the refresh operation must be prioritized over a memory access to ensure that the information stored in the memory cells is maintained. As such, when both access and refresh are requested, the access is delayed until the refresh is completed. Thus, performance is adversely impacted by refresh operation.

From the foregoing discussion, it is desirable to provide a memory array which reduces the adverse impact of the refresh operation.

SUMMARY OF THE INVENTION

The invention relates to ICs with a memory array. More particularly, the invention relates to improving performance of the memory array. In one embodiment, a memory cell array comprises a plurality of memory cells. The array includes a first and a second port coupled to the memory cells. In one embodiment, a cache memory is coupled to the first and second ports. During a read operation, data is read from one of the ports. If the data is located in the cache, then data is provided by the cache. Otherwise, data is read from the memory cell. A refresh control circuit for performing a refresh of the information stored within the memory cells is coupled to the array. The refresh control circuit refreshes memory cells through one of the ports while data is read out of the cache memory.

Further, there is provided an IC comprising a memory cell array. The array includes a first and a second port coupled to each of the memory cells; a cache memory coupled to the first and second ports; wherein the first and second ports comprise address terminals and data terminals; and a refresh control circuit coupled to the memory array for performing a refresh of the memory cells. In one embodiment, the refresh control circuit is coupled to the second port for controlling refresh operations of memory cells through the second port. Alternatively, the refresh circuit is coupled to the first port. In another embodiment, the refresh circuit is coupled to both the first and second ports for controlling refreshes through the ports.

Further, there is provided an IC which comprises a memory cell array having a plurality of dynamic memory cells; a first port and a second port for performing an access to at least one of the memory cells; a refresh control circuit to perform a refresh for the memory cells once within a retention time interval; a cache memory connected to at least one of the ports; a switching device coupled to at least one of the ports, the cache memory, and the memory cell array; wherein the switching device is operated to connect either one of the memory cell array or the cache memory to at least one of the ports in response to a read operation.

The memory array according to the invention comprises also a cache memory. The cache memory is connected to both ports and provides temporary storage of data from address location or locations that have been read from memory. There is a certain probability that an address which has been accessed by, for example, a read access, may be requested again within a few cycles. For example, when performing a program loop, the same address location can be read repeatedly several times. In the case where read and refresh operations are requested through the same port (e.g., conflict), a wait cycle can be avoided if the data from the requested address is present in the cache. This is because data from the read access can be provided by the cache while the main memory is refreshed.

In one embodiment, the cache memory comprises static memory cells which need not to be refreshed. The cache memory comprises at least one element. An element comprises a tag portion, an address portion, and a data portion linked together. When the tag is enabled, the address and data portions contain valid data. In one embodiment, the data portion has the size of the data width of the external data bus. The address is indicative of the memory cells whose data content is stored in the data portion. If the tag is enabled (e.g., when the cache is updated), the address associated with the element is valid and the data portion contains valid data.

When a read command is received, the memory device first compares the address of the read operation with the addresses stored in all the address portions of the elements in the cache memory. Preferably, the address of the access is compared with the address portions of the elements having an enabled tag. If the requested address matches, the data is read out from the cache memory rather than from the regular memory cell array. If there is no address match, the data is retrieved from the regular memory cell array. The access to the memory cell array can be started in parallel to the matching operation performed on the cache memory. The address matching operation can be performed faster than a decoding of an address in the regular memory cell array. In one embodiment, the regular decoding is stopped when the cache memory indicates a match.

During a read operation performed on the regular memory cell array, all the memory cells of a row are enabled at the same time. The I/O data bus width is usually a subset of a complete row within the regular memory cell array. During a read operation performed on the regular memory cell array, excess memory cells are conditioned and only a subset of data signals are finally selected and forwarded to the read port. This process consumes considerable power which can be saved when the data to be read out is found in the cache memory and consequently, the access to the regular memory cell array is aborted.

DETAILED DESCRIPTION

Figure 1:
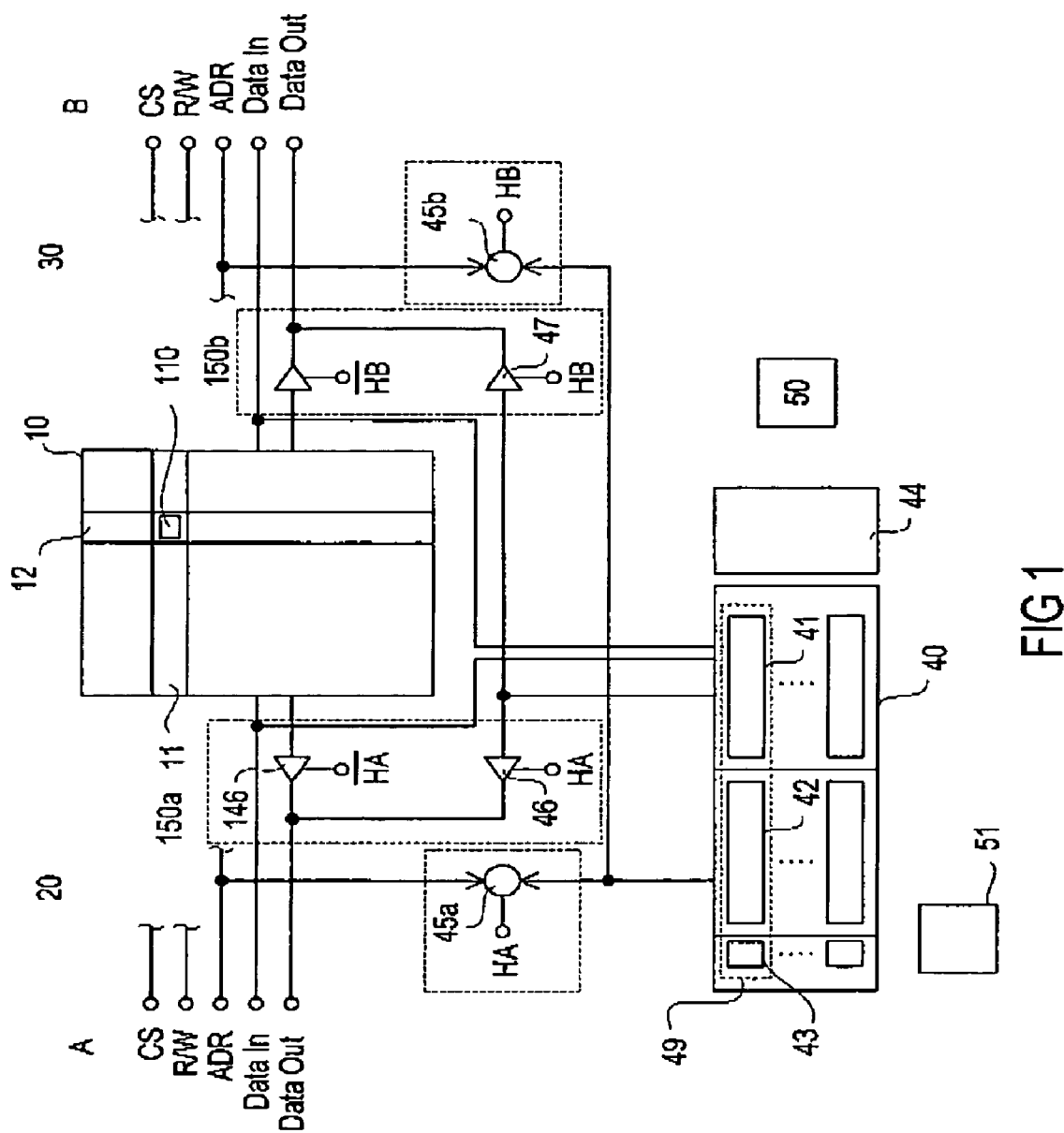
FIG. 1 shows a block diagram of a memory array in accordance with one embodiment of the invention.

The memory device shown in FIG. 1 comprises a memory cell array 10 having a plurality of memory cells in which digital information is stored. In one embodiment, the memory cells comprise dual port memory cells. Providing memory cells with other number of ports (e.g., single or more than 2) is also useful. For dual port memory cells, each cell is coupled to first and second bitlines and first and second wordlines. The memory cells of the array are arranged in rows and columns, for example row 11 and column 12. The memory cells of a row are coupled to first and second wordlines and the memory cells of a column are coupled to first and second bitlines.

For a DRAM cell, the charge stored therein decreases through leakage currents. In order not to loose the information, the charge is refreshed periodically. The refresh operations are controlled by a refresh control circuit 50. The time between two refresh cycles of a memory cell is referred to as the retention time.

In the dual port memory array, a memory access to any of the memory cells can be performed through the first port 20 or through the second port 30. As shown, each port includes control and data paths. For example, the control path receives enable or select (CS), read/write (R/W), and address (ADR) signals and the data path includes data in and data out signals. Although the data in and data out signal path are shown as separate paths, it is understood that the data paths could be combined through the use of a bi-direction data signal path.

A port is selected by providing the appropriate control signals. For example, if an access through port A is desired, an active CSA signal is provided along with the appropriate R/W signal (e.g., R/W=1) and address information. Based on the address information, the appropriate first wordline and first bitline are selected. For a read access, data is provided on the data out path from the array. A read access can be indicated by R/W=1. Alternatively, a read access can be indicated by R/W=0. For a write access, data is provided on the data in path. The write access can be indicated by R/W=0. Alternatively, a write access can be indicated by R/W=1. Similarly, the second port can be accessed by providing the appropriate control signals to the second port.

In one embodiment, a refresh operation is performed through one of the ports. Preferably, the refresh operation is performed through only one of the ports, for example, the second port 30. Providing a memory array which can be refreshed via either of the ports is also useful.

When a memory access and refresh operation are concurrently initiated, a contention occurs. Conventionally, to ensure that the memory cells are refreshed within the retention time, priority is given to the refresh operation over the memory access. The memory access is delayed by a wait cycle until the refresh is completed. This decreases system performance.

In accordance with one embodiment of the invention, performance degradation due to conflicts can be reduced by providing the array with a cache memory 40. The cache memory allows temporary storage of data which is read from the memory array. Alternatively, the cache memory can provide temporary storage for data which are written to the array. Providing a cache memory which can serve as a temporary storage of data read from and/or written to the array is also useful. The cache memory 40 is connected to data and address paths of first and second ports 20 and 30. Connecting the cache to the control path (e.g., CS and/or RW signals) is also useful. For memory arrays having more than two ports, the cache memory can be coupled to all or some of the ports. In another embodiment, the memory array comprises a single port array having its port coupled to the cache memory.

In one embodiment, when a read operation is performed through one of the ports, the cache memory 40 is involved. First, it is determined whether the data to be read out of the memory is present in the cache memory 40. If data is contained in the cache memory, the data is read from the cache memory 40 instead of from the array. The cache can be provided with select circuit which selectively provides data to either data path for port A or port B.

In one embodiment, the cache memory is designed such that accesses from the cache are completed faster or about the same time as a read access from the memory cell array 10. If, during an access such as a read access, data from the location associated with the access is not present in the cache memory 40, the data is read from the memory cell array 10 as described above. In one embodiment, during such a read access, the data read from memory array 10 is also stored in the cache memory 40 in parallel. There is a certain probability that an address which has been accessed will be accessed again within a few cycles. For example, computer programs often perform loop operations which come across the same portions of the program code or data repeatedly. When an address which has been previously accessed by a read operation is requested, data from that address maybe present in the cache. If the data is in the cache, then data is supplied by the cache memory 40 instead of from the memory cell array 10. It is also useful to store data which is written into the memory cell array 10 in parallel into the cache memory 40.

The cache memory 40 comprises at least one cache element 49. A cache element comprises a tag portion 43, address storage portion 42, and data storage portion 41. The data storage portion 41 preferably is the size of the input/output word length. The address storage portion 42 stores an address corresponding to the address of the memory cell array 10 of which the data in the data storage portion 41 is a duplicate. The tag portion 43 indicates whether the corresponding address and data portions 42 and 41 contain valid information or not. For example, if the tag 43 stores a "1", then address portion 42 and data portion 41 contain valid data (e.g., active cache element). If the tag portion 43 contains a "0", then the corresponding address and data storage portions are invalid (e.g., inactive cache elements). The number of elements can be designed to accommodate specific needs of the application. The larger the number of elements, the higher the probability that the cache contains the needed data, thus reducing refresh conflicts. However, the higher hit probability is achieved at the cost of chip area, which increases chip size. Preferably, the number of elements is selected to optimize performance needs.

The cache memory 40, in one embodiment, comprises a ring counter 44. The ring counter is used to point to cache elements. Preferably, the ring counter points to active cache elements. For example, when a read operation is to be performed through one of the ports (e.g., port A), the address ADR of the memory cell to be read is supplied to an address comparator 45. In one embodiment, a comparator is associated with each port. For example, ADR would be provided to comparator 45a for a port A read access or to comparator 45b for a port B read access. Providing a comparator for both ports is also useful. The address comparator compares this address to all the addresses within the cache memory 40 which are indicated as active by an active tag 43. In a preferred embodiment, the ring counter 44 points to an active cache element which has been most recently accessed (e.g., either read from or written to). After each comparison which results in no match found (miss), the ring counter points to the next most recently accessed active cache element until all active elements have been compared or a match is found (hit).

A cache controller 51 performs the sequencing of this associative or comparison operation. If a hit is determined, a data path control circuit 150 is provided to select the data path between the cache memory and the port while the data path between the memory array and port is deselected. This enables data to be read from the cache memory instead of the memory array. A data path control circuit is provided for each port (e.g., 150a for port A and 150b for port B). In one embodiment, a data path control circuit comprises first and second switches 146 and 46. The first switch is coupled to the data path between the cache memory and port and the second switch is coupled to the memory array and the port. In one embodiment, the switches comprise tri-state buffers. Other types of switches or multiplexers can also be used.

When a switch is activated, the data path, to which it is coupled, is coupled to the port. Deactivating a switch decouples its respective data path from the port. The first and second switches, in one embodiment, are controlled by complementary control signals H and /H. The complementary control signals are generated by, for example, address comparator in conjunction with active read signal. In one embodiment, comparator for port A generates complementary control signals Har and /Har to control data path control circuit 150a while comparator for port B generates complementary control signals Hbr and /Hbr to control data path control circuit 150b.

As explained above, the memory cells of a memory cell array 10 are connected to two ports 20 and 30 through which data can be read out of the memory cells or written into the memory cells. In one embodiment, the second port 30 is also designed to refresh the memory cells. It must be ensured that a refresh is performed for each of the memory cells within the retention time interval so that the charge stored in the storage node of a memory cell is always strong enough to be detected. Consequently, a refresh is prioritized over a memory access request. In one embodiment, when a contention takes place (e.g., the memory access and refresh requested via the second port 30), a wait cycle would be performed for the read access under normal conditions. This wait cycle can be avoided when a cache hit is detected. When port 20 is free, the refresh can be shifted to port 20. A decoding operation can be performed in parallel to a cache hit or miss detection operation. In one embodiment, the cache hit determination process is completed faster than the memory access to the memory array. This makes it possible for a read operation to the memory to be aborted if a cache hit is determined. By starting a access through the cache memory 40 in parallel with the decoding of an access through memory cell array 10, no access time is lost if the data is not found in the cache memory 40.

In one embodiment, the decoding process comprises two stages. The first stage is used for the decoding process itself. The second stage is used to drive the respective wordline. The first stage performs a decoding operation in parallel to a cache hit/miss detection operation. If a cache hit is detected, the driving of a respective wordline is stopped. This advantageously reduces power consumption.

Figure 2:
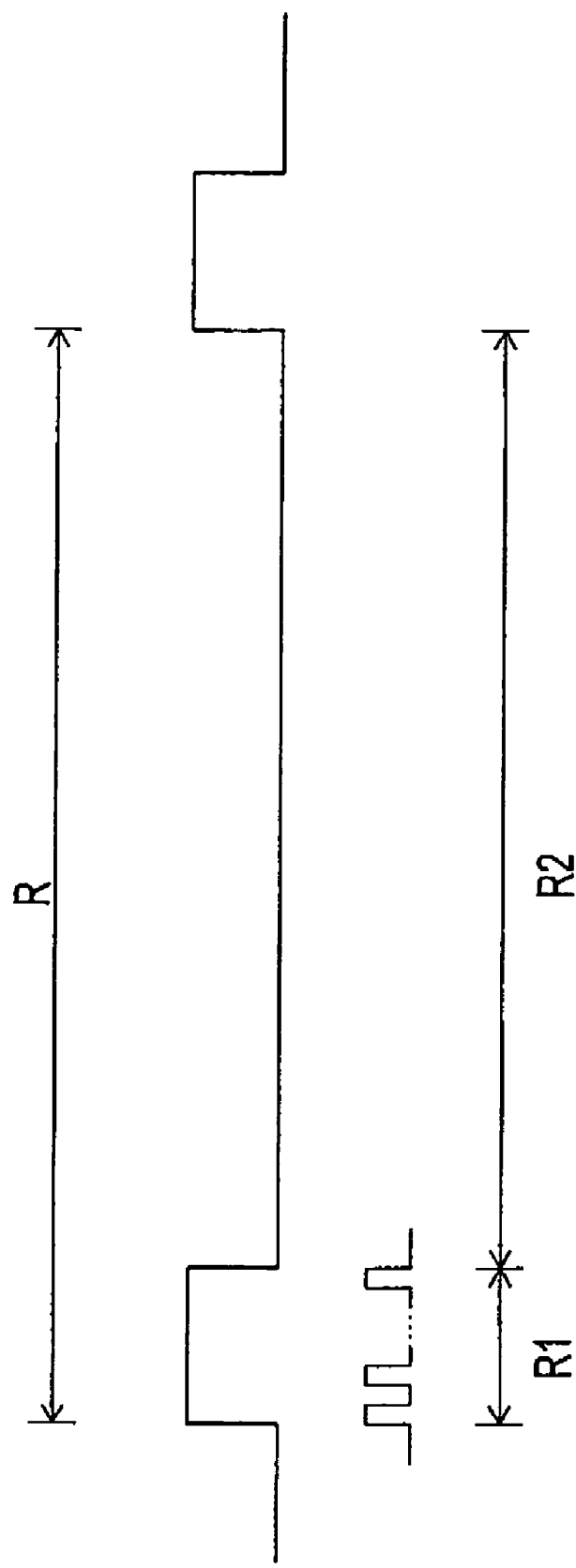
FIG. 2 shows timing signals.

With reference to FIG. 2, an example for the retention time is shown. The retention time R is the interval in which another refresh for the same row of memory cells must take place. For example, the retention time interval R has an active refresh time R1 in which a refresh address counter increments the row addresses of the memory cell array 10 and generates appropriate control signals in order to sense, read, amplify, and write back the information of the memory cells to a refreshed row. Such refresh operations are performed through the second port 30 of the memory cell array, for example, through wordline 116, bitline 117, and selection transistor 115 of memory cell 110 in FIG. 3. When a read access is requested through port 30 from the external system environment during time interval R1, the read access must be delayed until the refresh operation is completed. If, according to the invention, a cache hit is detected, the read request is delayed and can be performed in parallel to the refresh operations. During the time interval R2 a refresh is not performed and an access through either port 20 or 30 is possible without coming into conflict with a refresh operation. It is also useful to distribute the refreshes, for example, equally spaced over the retention time interval R.

Figure 3:
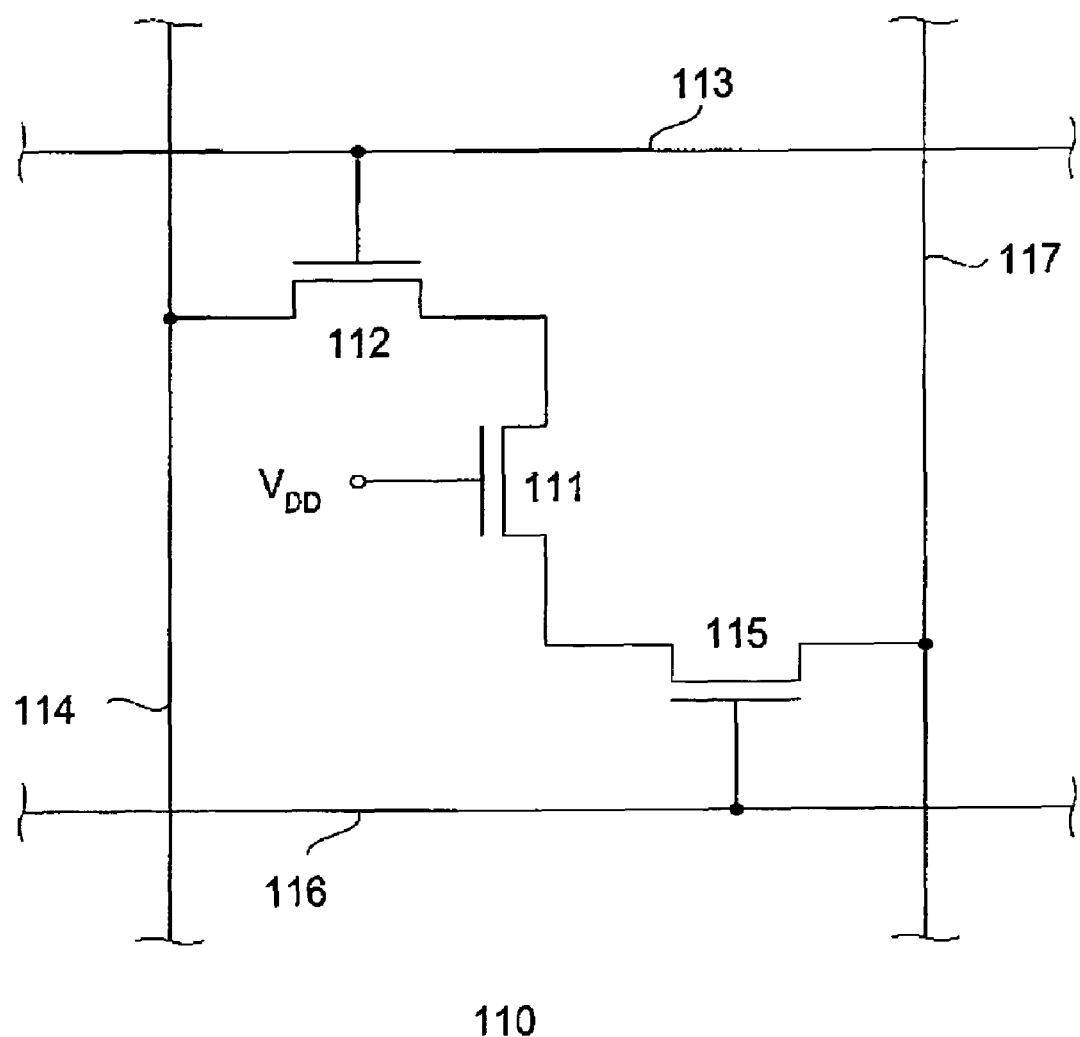
FIG. 3 shows a multi-port memory cell in accordance with one embodiment of the invention.

FIG. 3 shows a memory cell in accordance with one embodiment of the invention. As shown, the memory cell includes a storage node 111 in which a charge representing the information is stored. The storage node is a transistor having a gate electrode connected to an active reference potential, for example, the $V_{DD}$. One side of the drain-source-path of the storage transistor 111 is connected to a first selection transistor 112. The gate electrode of the first selection transistor 112 is connected to a first wordline 113, and an end of the drain-source-path of the first selection transistor 112 is connected to a first bitline 114. The other end of the drain-source-path of the storage transistor 111 is connected to a second selection transistor 115. The gate electrode of the second selection transistor 115 is connected to a second wordline 116, and an end of the drain-source-path of the second selection transistor 115 is connected to a second bitline 117. The storage node 111 can be accessed through the first selection transistor 112 or, alternatively, through the second selection transistor 115.

With the invention having been particularly shown and described with reference to various embodiments, it will be recognized by those skilled in the art that modifications and changes may be made to the present invention without departing form the spirit and scope thereof. The scope of the invention should therefore be determined not with reference to the above description but with reference to the appended claims along with their full scope of equivalents.

The invention claimed is:

1. An IC comprising:
   a memory cell array having a plurality of memory cells, wherein each memory cell includes at least a first port and at least a second port, the first and second ports of the memory cells forming at least first and second access ports of the memory cell array for accessing the memory cells;
   a cache memory coupled to said first and second access ports, wherein during a read operation to the memory cell array to obtain read data through one of said first and second access ports, the cache memory provides the read data if the read data is contained therein or the memory cell array provides the read data if the read data is not contained in the cache memory; and
   a refresh control circuit for performing refresh operations for said memory cells, wherein during a memory access conflict between the read and refresh operations, the refresh control circuit allows both read and refresh operations to be performed if the read data is stored in the cache memory.

2. An IC comprising:
a memory cell array having a plurality of memory cells, wherein the memory cell includes at least first and second ports forming a memory cell array with at least first and second access ports for accessing the memory cells;
a cache memory coupled to said first and second access ports, wherein during a read operation to the memory cell array to obtain read data through one of said first and second access ports, the cache memory provides the read data if the read data is contained therein or the memory cell array provides the read data if the read data is not contained in the cache memory, wherein said cache memory comprises a tag portion, an address portion, and a data portion corresponding to each other, wherein said tag portion indicates if said corresponding address and data portions contain valid address and data values; and
a refresh control circuit for performing refresh operations.

3. The IC according to claim 2, wherein said first and second access ports each comprises an address path and a data read path, said address paths of said first and second ports being connected to said address portion of said cache memory and said data read paths of said first and second ports being connected to said data portion.

4. The IC according to claim 3, wherein said cache memory comprises an address comparator which is coupled to said address path of at least one of said first and second access ports.

5. The IC according to claim 4, wherein said address comparator compares an address being provided through at least one of said access ports and an address being provided from said address portion of said address memory, and in case of a match, outputs the data stored in the corresponding memory cell onto the data read path of said at least one of said access ports.

6. The IC according to claim 5, wherein in case of said match of addresses a refresh for a row of memory cells within the memory cell array is performed through the second access port.

7. The IC according to claim 6, wherein each memory cell of said memory cell array comprises a first selection transistor coupled to said first access port and a second selection transistor coupled to said second access port and a storage node connected to said first and second selection transistors.

8. The IC according to claim 7, wherein said storage node comprises a storage transistor, a drain-source-path of said storage transistor being coupled between said first and second selection transistors, and a control terminal of said storage transistor being coupled to a reference potential.

9. The IC according to claim 5, wherein each memory cell of said memory cell array comprises a first selection transistor coupled to said first access port and a second selection transistor coupled to said second access port and a storage node connected to said first and second selection transistors.

10. The IC according to claim 9, wherein said storage node comprises a storage transistor, a drain-source-path of said storage transistor being coupled between said first and second selection transistors, and a control terminal of said storage transistor being coupled to a reference potential.

11. The IC according to claim 1, wherein each memory cell of said memory cell array comprises a first selection transistor coupled to said first access port and a second selection transistor coupled to said second access port and a storage node connected to said first and second selection transistors.

12. The IC according to claim 11, wherein said storage node comprises a storage transistor, a drain-source-path of said storage transistor being coupled between said first and second selection transistors, and a control terminal of said storage transistor being coupled to a reference potential.

13. An IC comprising:
a memory cell array having a plurality of dynamic memory cells, wherein the memory cells comprise at least first and second ports to form a memory array having at least first and second access ports accessing the memory cells;
a refresh control circuit to perform a refresh for said memory cells once within a retention time interval;
a cache memory connected to at least one of said ports;
a switching device coupled to said at least one of said ports, said cache memory, and said memory cell array; and
said switching device being operated to connect either one of said memory cell array and said cache memory to said at least one of said access ports in response to a read operation.

14. The IC according to claim 13, wherein said refresh control circuit performs a refresh operation while a read operation is performed through at least one of said access ports from said cache memory.

15. The IC according to claim 13, wherein said cache memory comprises a tag portion, an address portion, and a data portion corresponding to each other, wherein said tag portion indicates if said address and data portions contain valid address and data values.

16. The IC according to claim 13, wherein each memory cell of said memory cell array comprises a first selection transistor coupled to said first access port and a second selection transistor coupled to said second access port and a storage node connected to said first and second selection transistors.

17. An IC comprising:
a memory cell array having a plurality of memory cells with at least first and second ports forming a memory cell array with at least first and second access ports;
a cache memory coupled to said first and second access ports, wherein said cache memory can be accessed through either of said access ports;
said first and second access ports comprising address terminals and data terminals; and
said second access port being controlled by a refresh control circuit to perform a refresh of said memory cells.

18. An IC comprising:
a memory cell array having a plurality of memory cells with at least first and second ports forming a memory cell array with at least first and second access ports;
a cache memory coupled to said first and second access ports;
said first and second access ports comprising address terminals and data terminals; and
said second access port being controlled by a refresh control circuit to perform a refresh of said memory cells;
wherein a refresh operation is performed for a row of memory cells through said second access port, and a read command received through said second access port is performed through said cache memory in parallel to said refresh operation.

19. The IC according to claim 18, wherein each memory cell of said memory cell array comprises a first selection transistor coupled to said first access port and a second selection transistor coupled to said second access port and a storage node connected to said first and second selection transistors.

20. An IC comprising:
a memory cell array having a plurality of memory cells, wherein the memory cell includes at least first and second ports forming a memory cell array with at least first and second access ports, wherein at least one of the first and second ports are used for memory accesses; and
a cache memory coupled to at least one of the access ports used for memory accesses, wherein during a read operation to the memory cell array to obtain read data, the cache memory provides the read data if the read data is contained therein or the memory cell array provides the read data if the read data is not contained in the cache memory; and
wherein the at least one of the first and second access ports used for memory accesses comprises an address path and a data read path, said address path connected to said address portion of said cache memory and said data read path of the at least one of the first and second access ports for memory accesses is connected to said data portion.

21. The IC according to claim 20 comprises a refresh control circuit for performing refresh operations through the other of the first and second access ports.

22. The IC according to claim 20 wherein the at least first and second access ports are used for memory accesses.

23. The IC according to claim 22 wherein said first and second access ports each comprises an address path and a data read path, said address paths of said first and second ports being connected to said address portion of said cache memory and said data read paths of said first and second ports being connected to said data portion.

24. The IC of claim 23 comprises a refresh control circuit for performing refresh operations through either one of the access ports.

25. An IC comprising:
a memory cell array having a plurality of memory cells, wherein each memory cell includes at least a first port and at least a second port, the first and second ports of the memory cells forming at least first and second access ports of the memory cell array for accessing the memory cells;
a cache memory coupled to said first and second access ports;
a refresh control circuit for performing refresh operations for said memory cells;
wherein during a conflict between a read operation to the memory cell array and a refresh operation, the cache memory provides read data if the read data is contained therein or the read operation is stalled until the conflict is over if the read data is not contained in the cache memory.

* * * * *